(12) United States Patent
Yang et al.

(10) Patent No.: US 6,950,331 B2
(45) Date of Patent: Sep. 27, 2005

(54) ORGANIC BISTABLE DEVICE AND ORGANIC MEMORY CELLS

(75) Inventors: Yang Yang, Los Angeles, CA (US); Liping Ma, Los Angeles, CA (US); Jie Liu, Los Angeles, CA (US)

(73) Assignee: The Regents of the University of California, Oakland, CA (US)

( * ) Notice: Subject to any disclaimer, the term of this patent is extended or adjusted under 35 U.S.C. 154(b) by 65 days.

(21) Appl. No.: 10/399,586

(22) PCT Filed: May 24, 2001

(86) PCT No.: PCT/US01/17206
§ 371 (c)(1),
(2), (4) Date: Jul. 8, 2003

(87) PCT Pub. No.: WO02/37500
PCT Pub. Date: May 10, 2002

(65) Prior Publication Data
US 2004/0027849 A1 Feb. 12, 2004

Related U.S. Application Data
(60) Provisional application No. 60/244,734, filed on Oct. 31, 2000.

(51) Int. Cl.[7] .............................................. G11C 11/00
(52) U.S. Cl. ........................ 365/148; 365/100; 365/151
(58) Field of Search ................................ 365/148, 100, 365/151, 153, 163, 175

(56) References Cited

U.S. PATENT DOCUMENTS

| | | | |
|---|---|---|---|
| 3,719,933 A | | 3/1973 | Wakabayashi et al. |
| 4,371,883 A | | 2/1983 | Potember et al. |
| 4,652,894 A | | 3/1987 | Potember et al. |
| 5,075,738 A | * | 12/1991 | Matsuda et al. ............... 257/49 |
| 5,136,212 A | | 8/1992 | Eguchi et al. |
| 5,563,424 A | | 10/1996 | Yang et al. |
| 6,055,180 A | | 4/2000 | Gudesen et al. |
| 6,122,031 A | * | 9/2000 | Terada et al. ................ 349/155 |
| 6,600,473 B1 | * | 7/2003 | Kobayashi et al. ............ 345/97 |
| 6,774,880 B2 | * | 8/2004 | Kobayashi .................... 345/84 |

OTHER PUBLICATIONS

The Electrochemical Society—Current Affairs—Abstracts of "Recent News" Papers, Presented at Electronics Division Semiconductor Symposia, Los Angeles, CA (1962).

Ovshinsky, S.R., "Localized States in the Gap of Amorphous Semiconductors," Physical Review Letters, vol. 36, No. 24, pps. 1469–1472 (1976).

Kriger, Y.G., Yudanov, N.F., Igumenov, I.K. and Vashchenko, S.B., "Study of Test Structures of a Molecular Memory Element," Journal of Structural Chemistry, vol. 34, No. 6, pps. 966–970 (1993).

Hovel, H.J. and Urgell, J.J., "Switching and Memory Characteristics of ZnSe—Ge Heterojunctions," Journal of Applied Physics, vol. 42, No. 12, pps. 5076–5083 (1971).

Kumai, R., Okimoto, Y. and Tokura, Y., "Current–Induced Insulator–Metal Transition and Pattern Formation in an Organic Charge–Transfer Complex," Science, vol. 284, pps. 1645–1647 (1999).

(Continued)

*Primary Examiner*—Gene N. Auduong
(74) *Attorney, Agent, or Firm*—Shapiro & Dupont LLP (57) ABSTRACT

A bistable electrical device (50) employing a bistable body (52) and a high conductivity material (54). A sufficient amount of high conductivity material (54) is included in the bistable body (52) to impart bistable between a low resistance state and a high resistance state by application of an electrical voltage (60).

27 Claims, 8 Drawing Sheets

OTHER PUBLICATIONS

Potember, R.S. and Poehler, T.O., "Electrical Switching And Memory Phenomena in Cu–TCNQ Thin Films," Appl. Phys. Lett. 34(6), pps. 405–407 (1979).

Garnier, F., Hajlaoui, R., Yassar, A., Srivastava, P., "All-Polymer Field–Effect Transistor Realized By Printing Techniques," Science, vol. 265, pps. 1684–1686 (1994).

Hide, F., Diaz–Garcia, M.A., Anderson, M.R., Pei, Q., Heeger, A.J., "Semiconducting Polymers: A New Class Of Solid–State Laser Materials," Science, 273(5283), pps. 1833–1836 (1996).

Fujita, W. and Awaga, K., "Room–Temperature Magnetic Bistability in Organic Radical Crystals," Science, vol. 286, pps. 261–262 (1999).

Burroughes, J.H., Bradley, D.D.C., Brown, A.R., Marks, R.N., Mackay, K., Friend, R.H., Burns, P.L. and Holmes, A.B., "Light–Emitting Diodes Based On Conjugated Polymers," Nature, vol. 347, pps. 539–541 (1990).

Yamada, T., Zou, D., Jeong, H., Akaki, Y. and Tsutsui, T., "Recoverable Degradation and Internal Field Forming Process Accompanies by the Orientation of Dipoles in Organic Light Emitting Diodes," Synthetic Metals 111–112, pps. 237–240 (2000).

Liu, J., Shi, Y., Ma, L. and Yang, Y., "Device Performance and Polymer Morphology in Polymer Light Emitting Diodes: The Control of Device Electrical Properties and Metal/Polymer Contact," Journal of Applied Physics, vol. 88, No. 2, pps. 605–609 (2000).

Hamada, Y., Adachi, C., Tsutsui, T. and Saito, S., "Blue-Light–Emitting Organic Electroluminescent Devices with Oxadiazole Dimer Dyes as an Emitter," Jpn. J. Appl. Phys., vol. 31, Pt. 1, No. 6A, pps. 1812–1816 (1992).

* cited by examiner

ORGANIC BISTABLE DEVICE AND ORGANIC MEMORY CELLS

RELATED APPLICATION

This application is a 371 of PCT/US01/17206, filed May 24, 2001, claims the benefit of U.S. Provisional Application No. 60/244,734, filed Oct. 31, 2000.

This invention was made with Government support under Grant No. N00014-98-1-0484, awarded by the Office of Naval Research. The Government has certain rights in this invention.

BACKGROUND OF THE INVENTION

1. Field of the Invention

The present invention relates generally to electronic memory cells and switches. More particularly, the present invention involves electronic memory devices which utilize memory elements that exhibit bistable electrical behavior.

2. Description of Related Art

The publications and other reference materials referred to herein to describe the background of the invention and to provide additional details regarding its practice are hereby incorporated by reference. For convenience, the reference materials are numerically referenced and identified in the appended bibliography.

Many electronic memory and switching devices typically employ some type of bistable element that can be converted between a high impedance state and a low impedance state by applying an electrical voltage or other type of writing input to the device. This threshold switching and memory phenomena have been demonstrated in both organic and inorganic thin-film semiconductor materials. For example, this phenomenon has been observed in thin films of amorphous chalcogenide semiconductor (1), amorphous silicon (2), organic material (3) and ZnSe—Ge heterostructures (4).

The above materials have been proposed as potential candidates for nonvolatile memories. The mechanism of electrical bistability has been attributed to processes such as field and impact ionization of traps, whereas in chalcogenide semiconductors they involve amorphous to crystalline phase changes. Analogous memory effects in the leakage current of ferroelectric $BaTiO_3$ or $(Pb_{1-y}La_y)(Zr_{1-x})O_3$-based heterostructures have also been reported and discussed in terms of band bending due to spontaneous polarization switching. Electrical switching and memory phenomena have also been observed in organic charge transfer complexes such as Cu-TCNQ[5,6].

A number of organic functional materials have attracted more and more attention in recent years due to their potential use in field-effect transistors (7), lasers (8), memories (9,10) and light emitting diodes and triodes (11,15). Electroluminesent polymers are one of the organic functional materials that have been investigated for use in display applications. In addition to display applications, electroluminesent polymers have been doped with high dipole moment molecules in order to obtain a memory effect (12). This memory effect is observed when dipole groups attached to side chain of the polymer rotate due to application of a threshold bias voltage. Unfortunately, rotation of the dipole groups takes a relatively long time. Also, doping of the polymer reduces the electroluminescence of the doped polymer.

Electronic addressing or logic devices are presently made from inorganic materials, such as crystalline silicon. Although these inorganic devices have been technically and commercially successful, they have a number of drawbacks including complex architecture and high fabrication costs. In the case of volatile semiconductor memory devices, the circuitry must constantly be supplied with a current in order to maintain the stored information. This results in heating and high power consumption. Non-volatile semiconductor devices avoid this problem. However, they have the disadvantage of reduced data storage capability as a result of higher complexity in the circuit design, and hence higher cost.

A number of different architectures have been implemented for memory chips based on semiconductor material. These structures reflect a tendency to specialization with regard to different tasks. Matrix addressing of memory location in a plane is a simple and effective way of achieving a large number of accessible memory locations while utilizing a reasonable number of lines for electrical addressing. In a square grid with n lines in each direction the number of memory locations is $n^2$. This is the basic principle, which at present is implemented in a number of solid-state semiconductor memories. In these types of systems, each memory location must have a dedicated electronic circuit that communicates to the outside. Such communication is accomplished via the grid intersection point as well as a volatile or non-volatile memory element which typically is a charge storage unit. Organic memory in this type of matrix format has been demonstrated before by using an organic charge transfer complex. However such organic memories require transistor switches to address each memory element leading to a very complex device structure. Accordingly, there is a continuing need to provide new and improved electrically bistable structures which may be used in memory devices.

SUMMARY OF THE INVENTION

In accordance with the present invention, bistable electrical devices are provided that are convertible between a low resistance (impedance) state and a high resistance (impedance) state. The bistable electrical devices are well suited for use as electrical switching and memory devices. The bistable electrical devices of the present invention include a bistable body which is electrically convertible between a low resistance state and high resistance state by application of a suitable electrical voltage across the bistable body. The bistable body is composed of an organic, low-conductivity material and a sufficient amount of a high conductivity material to render the bistable body convertible between the low resistance and the high resistance state.

Bistable electrical devices in accordance with the present invention include a first electrode located at one location on the bistable body and a second electrode attached to another location on the bistable body wherein application of a proper electrical voltage between the two electrodes results in conversion of the bistable body between the low resistance and high resistance states. As a feature of the present invention, the high conductivity material is provided as one or more discrete layers located within the bistable body. The high conductivity material may also be disbursed throughout the bistable body in the form of nanoparticles. The high conductivity material used to form the bistable body can be a metal, conductive oxides, conducting polymer or organic conductor. The organic low conductivity material used in forming the bistable body can be an organic semi-conductor or organic insulator. Neither the low conductivity material nor the high conductivity material exhibits bistable behavior when taken alone. Bistable phenomena are only observed when the two components are combined together in accordance with the present invention.

The bistable electrical devices may be used to form a wide variety of memory devices wherein a memory input element is provided for applying voltage to the bistable body to convert the bistable body between the low electrical resistance state and the high electrical resistance state. The memory device further includes a memory readout element which provides an indication of whether the bistable body is in the low or high electrical resistance state. As a feature of the present invention, the memory read-out element may be a light-emitting diode which provides a visual indication of the electrical resistance state of the bistable body.

The above discussed and many other features and attendant advantages of the present invention will become better understood by reference to the following detailed description when taken in conjunction with the accompanying drawings.

DETAILED DESCRIPTION OF THE INVENTION

Figure 1:
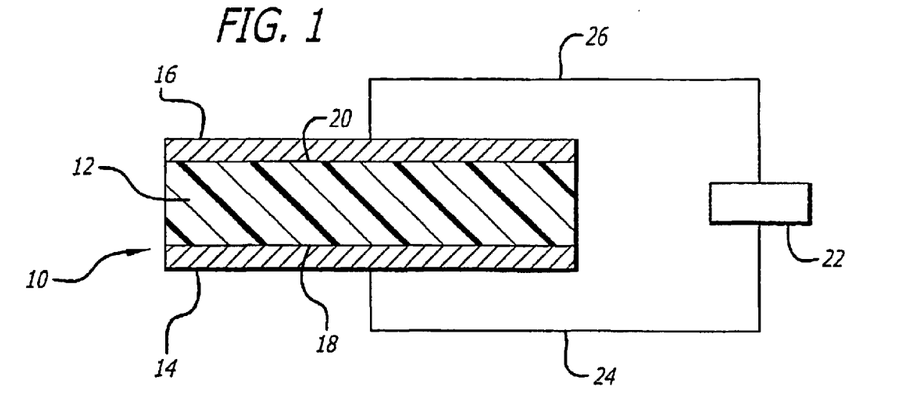
FIG. 1 is a diagrammatic representation of a bistable electrical device in accordance with the present invention.

A bistable electrical device in accordance with the present invention is shown generally at 10 in FIG. 1. The device 10 includes a bistable body 12 which is sandwiched between a first electrode 14 and a second electrode 16. The bistable body 12 is shown in the form of a layer. However, it will be understood that the bistable body can be provided in any number of different shapes. Bistable bodies in the form of a thin layer or film are preferred since fabrication techniques for forming thin films are well known.

The bistable body 12 includes a first surface 18 which defines a first electrode location on which the first electrode 14 is attached. A second surface 20 is located on the other side of the bistable body 12. This second surface 20 defines a second electrode location on which the second electrode 16 is attached.

The bistable electrical device 10 is connected to an electronic control unit 22 via electrical connections 24 and 26. The control unit 22 is capable of providing an electrical voltage bias across the bistable body 12 via the two electrodes 14 and 16 to convert the bistable body between low resistance and high resistance states. In addition, the control unit is capable of, among other things, measuring current to determine the electrical resistance of the bistable body.

The bistable body 12 includes a low conductivity material and an amount of high conductivity material which imparts bistable electrical characteristics to the body. The incorporation of the high conductivity material into the low conductivity material can be accomplished in a number of different ways. The two materials may be co-evaporated to form a molecular solution where the bistable body does not have distinct phases as shown in FIG. 1. Alternatively, the high conductivity material may be included as one or more discrete layers (FIG. 2) or as nanoparticles or molecular clusters (FIG. 3).

Figure 2:
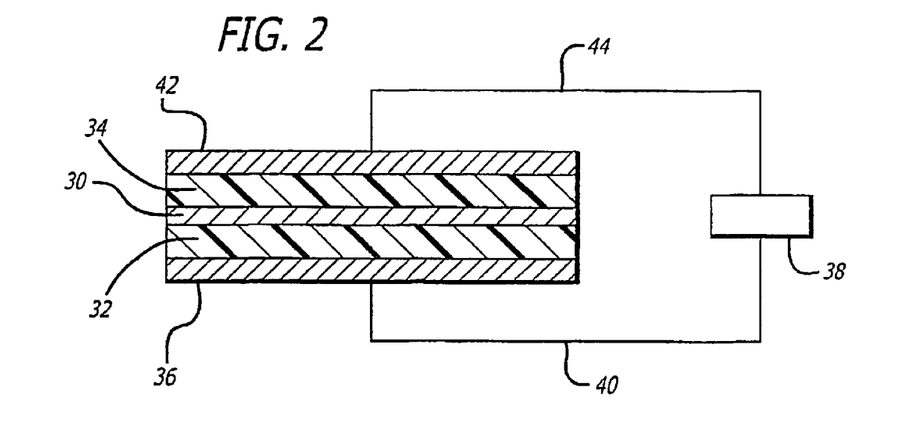
FIG. 2 is a diagrammatic representation of a preferred exemplary bistable electrical device in accordance with the present invention wherein the high conductivity material is provided as a single layer located within the bistable body.

Referring to FIG. 2, the high conductivity material is provided as a single layer 30 which is sandwiched between a first low conductivity layer 32 and a second low conductivity 34. A first electrode 36 is provided which is connected to the electronic control unit 38 via electrical connection 40. A second electrode 42 is provided which is connected to the electronic control unit 38 via electrical connection 44. The bistable electrical device in FIG. 2 is shown having a single high conductivity layer 30. It is also contemplated within the present invention that the bistable body may include multiple layers of high conductivity material located between alternating layers of low conductivity material.

Figure 3:
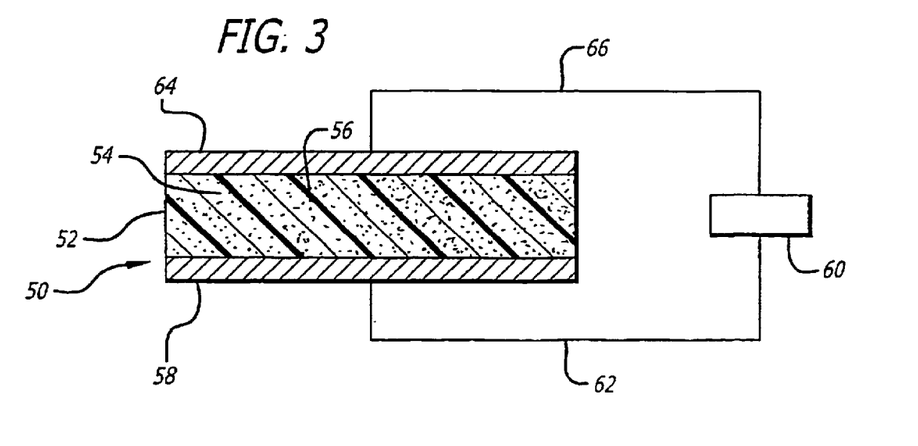
FIG. 3 is a diagrammatic representation of a preferred exemplary embodiment of the bistable electrical device in accordance with the present invention wherein the high conductivity material is dispersed as clusters or nanoparticles throughout the bistable body.

An alternate type of bistable device in accordance with the present invention is shown in FIG. 3 at 50. The bistable device 50 includes a bistable body 52 that is made up of nanoparticles of high conductivity material 54 which are dispersed throughout low conductivity material 56. A first electrode 58 is connected to the electronic control unit 60 via electrical connection 62. Second electrode 64 is connected to the electronic control unit 60 via electrical connection 66.

The low conducting materials and high conducting materials which are used to make the bistable bodies shown in FIGS. 1–3 are the same. Suitable high conductivity materials include metals, such as aluminum, copper and silver. Other suitable metals can be high work function metals such as gold, nickel and middle work function metals such as magnesium and indium. Low work function metals may also be used such as calcium and lithium. Metal alloys of the above metals (e.g., lithium/aluminum alloys) may also be used as the high conductivity material. Conductive oxides such as metal oxides are also suitable. Conducting polymers such as 3,4-polyethylenedioxy-thiophenepolystyrenesulfonate (PEDOT) or doped polyaniline are also suitable high conductivity material. Organic conductors such as buckminster fullerene may also be used as the high conductivity material.

Suitable low conductivity materials include organic semiconductors and organic insulators. Exemplary organic semiconductors include small molecular organic materials such as 2-amino-4,5-imidazoledicarbonitrile (AIDCN); tris-8-(hydroxyquinoline)aluminum (Alq); 7,7,8,8-tetracyanoquinodimethane (TCNQ); 3-amino-5-hydroxypyrazole (AHP). Oligomers such as polyanaline may also be used. Organic insulators include polymers such as polystyrene (PS), polycarbonate (PC), polymethylmethacrylate (PMMA), polyolefines, polyesters, polyamides, polyimides, polyurethanes, polyaccetals, polysilicones and polysulfonates. In addition semiconducting polymers may be utilized. Exemplary semiconducting polymers include poly(phenylene vinylene) (PPV), polyfluorene (PF), polythiophene (PT), poly(paraphenylene) (PPP) and their derivatives as well as copolymers.

If desired, the above insulating polymers may be doped with selective dopants such as charge blocking or trapping material, electron and hole transport material, and luminescent material. Charge blocking material include 2,9-dimethyl-4,7-diphenyl-1,10-phenanthroline (Bathocuproine, or BCP); electron transporting materials include tris-(8-hydroxyquinolinolato) aluminum (Alq3) and its derivatives, such as tris-(4-methyl-8-hydroxyquinolinolato) aluminum (Almq3); hole transporting materials include N,N-diphenyl-N,N-bis(3-methylphenyl)-1, 1-diphenyl-4,4 diamine (TPD) and N,N-diphenyl-N,N-bis(1-naphthylphenyl)-1, 1-diphenyl-4,4 diamine (NPB); luminescent material include 4,4-N,N-dicarbazole-biphenyl (CBP). With regards to the electrodes, conventional electrode material such as aluminum, copper, and other electrode metals, including alloys, may be used. Conducting metal oxides, such as indium tin oxide (ITO), indium oxide and other metal oxides are also suitable electrode material. In addition, conducting polymers such as PEDOT and doped polyanaline may be used.

The high conductivity material and low conductivity material may be combined in numerous different ways to form bistable bodies in accordance with the present invention that exhibit a reversible transition between high and low electrical resistance states. For example, the two materials may be co-evaporated to form a single phase bistable body (FIG. 1). The amounts of low conductivity and high conductivity material may be varied to achieve desired electrical resistance transition properties. A 1:1 molecular ratio of low conductivity to high conductivity material is preferred. However, the molecular ratio low conductivity to high conductivity material may range from 10:1 to 1:10.

The bistable body may also be a two-phase system as shown in FIG. 2 or 3. As shown in FIG. 2, the high conductivity material 30 is sandwiched as a thin layer between two layers of low conductivity material 32 and 34. The various layers are formed using spin casting and/or evaporation techniques which are well known in the art of electronic device fabrication. The high conductivity layer is preferably on the order of from 0.5 nm to 5 $\mu$m thick. Thicknesses on the order of 10 to 200 nm are preferred. The layers of low conductivity material are preferably on the order of from 5 nm to 1,000 nm thick. The low conductivity layers 32 and 34 may be made from the same material or they may be made from different low conductivity materials. For example, one of the low conductivity layers can be an organic insulator while the other may be an organic semiconductor.

The bistable body may also be in the form of a two-phase system as shown in FIG. 3 where nanoparticles or molecular clusters of high conductivity material 54 are dispersed throughout the low conductivity material 56. The nanoparticles and molecular clusters preferably have an average particle size of between 1 to 50 nm. Formation of a bistable body 52 as shown in FIG. 3 is accomplished using conventional evaporation techniques known in the electronic fabrication art for forming thin layers containing nanoparticles dispersed in a solid matrix.

Figure 4:
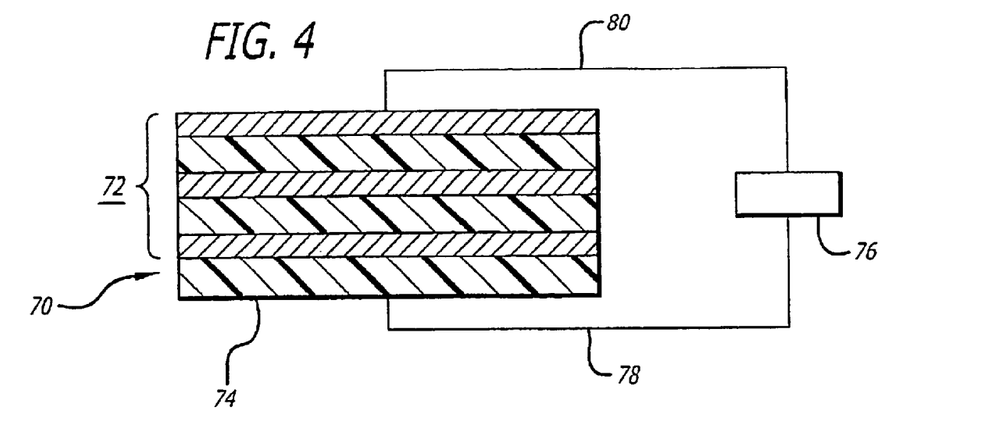
FIG. 4 is a diagrammatic representation of a preferred exemplary memory device in accordance with the present invention wherein the high conductivity material is in the form of a thin layer located within the bistable body and the memory read-out element is an LED.

A memory device in accordance with the present invention is shown generally at 70 in FIG. 4. The device includes a bistable electrical device 72 which has been deposited on a light-emitting diode (LED) 74. The memory device 70 is connected to a control unit 76 via electrical connections 78 and 80. The bistable device 72 is the same as the bistable device shown in FIG. 2. The control unit 76 provides voltage bias across the memory device to convert the bistable device 72 from high to low resistance states. The LED 74 provides a visual indication of which state the bistable device is in. The LED 74 may be made from any of the conventional materials used in making LEDs.

Figure 5:
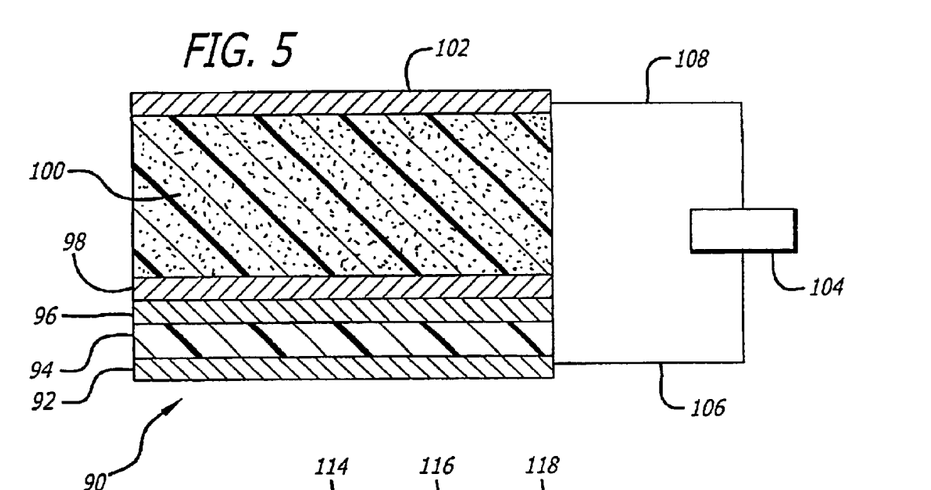
FIG. 5 is a diagrammatic representation of another preferred exemplary device in accordance with the present invention wherein the high conductivity material is dispersed as nanoparticles throughout the bistable body and the memory read-out element is an LED.

A memory device using a preferred exemplary LED is shown generally at 90 in FIG. 5. The device includes a layer 92 of indium tin oxide (ITO) onto which is deposited layers of poly(2-methoxy-5-(2'ethyl-hexyloxy)-1,4-phenylene vinylene (MEH-PPV) and polyethylenedioxy-thiophenepolystyrene-sulfonate (PEDOT) as shown at 94. A thin layer of aluminum 96 and calcium 98 are provided as the electrode. A bistable body 100 is provided which includes the nanoparticles of high conductivity material dispersed throughout the low conductivity material in the same manner as the bistable body shown in FIG. 3. A top electrode 102 is also provided. The memory device is connected to control unit 104 via electrical connections 106 and 108.

Figure 6:
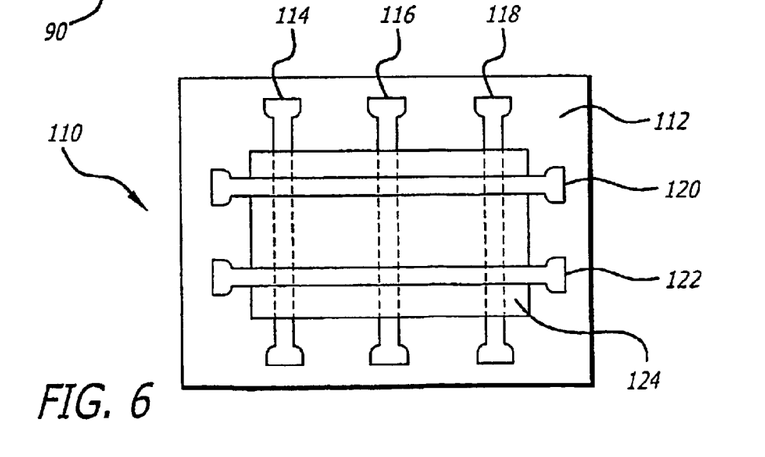
FIG. 6 is a simplified view of a memory matrix formed using a bistable body in accordance with the present invention.

A simplified top view of an exemplary memory matrix in accordance with the present invention is shown at 110 in FIG. 6. The memory matrix is deposited onto a suitable substrate such as glass or silicon 112. The matrix includes first electrodes or anodes 114, 116 and 118. Second electrodes or cathodes 120 and 122 are provided. A bistable body in the form of layer 124 is sandwiched between the electrodes. This arrangement provides 6 bistable devices at the intersections of the first and second electrodes. As will be appreciated, this is an extremely simplified matrix which is used only to demonstrate an exemplary use of the invention. In practice, large scale matrices will be fabricated employing numerous electrodes. The matrices will be both two and three dimensional Examples of practice are as follows:

EXAMPLE 1

A bistable device was fabricated as shown in FIG. 2. The first step in the fabrication of the device involved the vacuum deposition of a layer (50 nm thick) of aluminum (Al) on top of a pre-cleaned glass substrate. This Al functioned as the anode layer 36 of the device. Next, the first low conductivity layer 32, the thin metal layer 30, and the second low conductivity layer 34 were sequentially evaporated on top of the Al anode layer 36. Then, the cathode metal (Al) was evaporated onto the top layer 34 to form a cathode layer 42 which was 50 nm thick. The depositions were carried out in a vacuum of about $1\times10^{-6}$ torr and the thickness of the depositing species controlled by a quartz crystal monitor. The low conductivity layers 32 and 34 were 40 nm thick with the central high conductivity layer 30 being 20 nm thick. Aluminum was used for the central layer 30. 2-amino-4-5-imidazoledicarbonitrile (AIDCN) was used for the two low conductivity layers (32 and 34).

Figure 7:
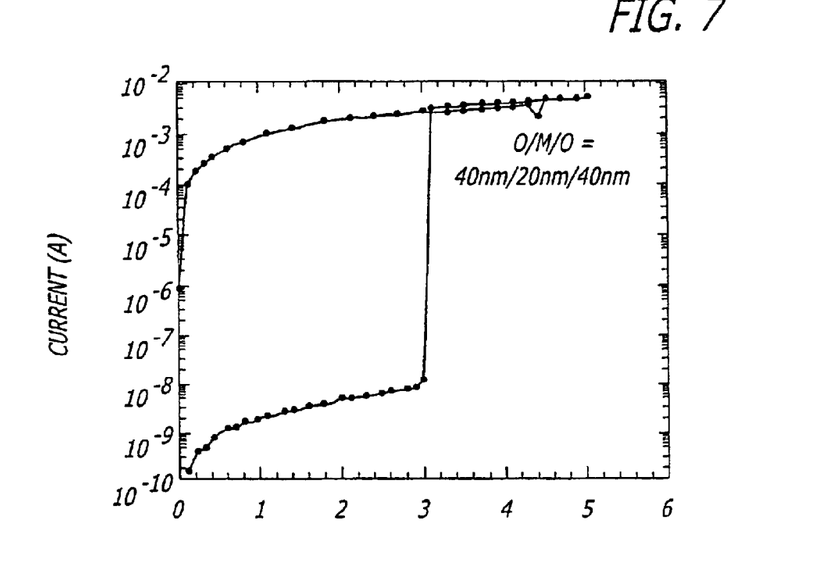
FIG. 7 is a graph of the current v.voltage (I-V) characteristics for a bistable electrical device as shown in FIG. 2 wherein the layer of high conductivity material is 20 nanometers (nm) thick and the two organic low conductivity layers are each 40 nm thick.

The I-V curves for this device are shown in FIG. 7. The voltage scan used was 0.1 volt/step. The bottom curve is the first bias sweep and the top curve is for the second bias sweep. During the first scan, there was a jump in current at approximately 3V. The injection current increased by nearly six orders of magnitude. However, the second voltage scan on the device yielded higher injection currents even at lower biases with the two I-V curves overlapping in the higher voltage regime (voltages higher than 3 volts). These two I-V curves show the bistability of the device and its usefulness for nonvolatile memory applications.

EXAMPLE 2

A bistable device was made in the same manner as Example 1 except that three high conductivity Al layers (each 20 nm thick) were deposited between alternating layers of AIDCN (each 20 nm thick). The device exhibited bistable characteristics in that the conductivity changed from $10^{-11}$ to $10^{-8}$ (1/ohm.cm) upon application of a 5 V. bias. The device was convertible back to a low conductivity state by application of a −5V bias.

EXAMPLE 3

Figure 8:
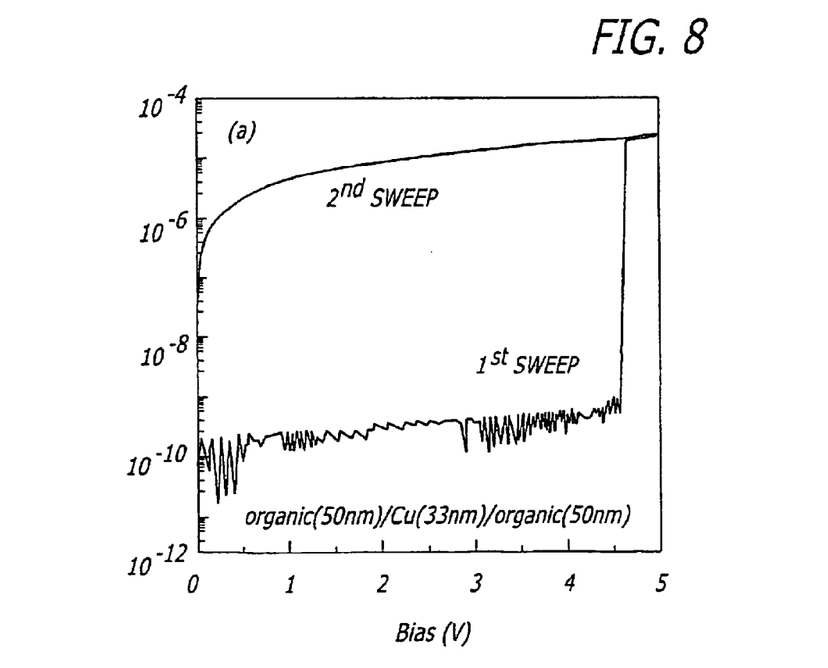
FIG. 8 is a graph of the I-V characteristics for the bistable electrical device shown in FIG. 2 wherein the thickness of the high conductivity material layer is increased to 33 nm and two organic low conductivity layers are each 50 nm thick.
Figure 9:
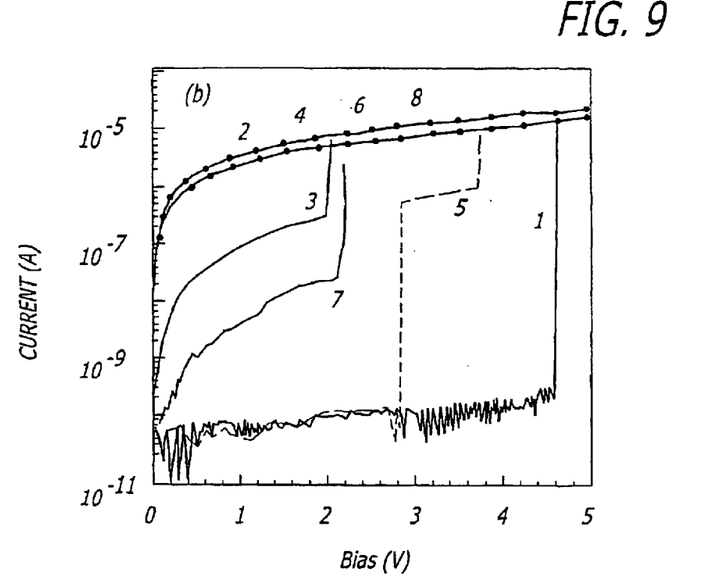
FIG. 9 is a graph of the I-V characteristics for multiple sweeps of a bistable electrical device as shown in FIG. 2 wherein reversibility of the conversion between low and high resistance states is shown.

A bistable device was made in the same manner as Example 1 except that Cu was substituted for Al as the high conductivity material in layer 30. The Cu layer was 33 nm thick and the two AIDCN layers 32 and 34 were 50 nm thick. The I-V curves are shown in FIG. 8 where it can be seen that the transition from the high resistance state to low resistance state is accompanied by a sharp change in current up to 5 orders in magnitude. FIG. 9 shows I-V curves for multiple sweeps. The numbers next to the curves correspond to the bias sweep sequence. The multiple sweeps shown in FIG. 9 demonstrate that the transition is reversible.

EXAMPLE 4

Figure 10:
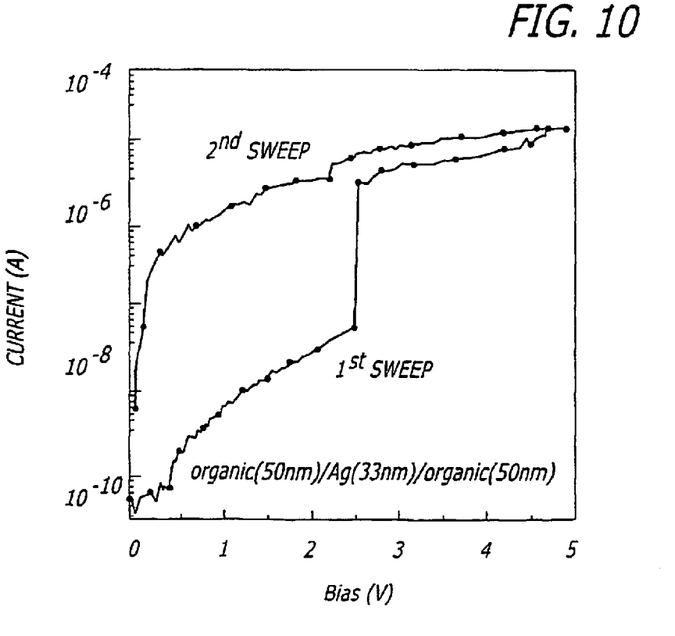
FIG. 10 is a graph of the I-V characteristics for a bistable electrical device as shown in FIG. 2 wherein the layer of high conductivity material is silver which is 30 nm thick and wherein each low conductivity organic layer is 50 nm thick.

A bistable device was made in the same manner as Example 1 except that Ag was substituted in place of Al as the high conductivity layer 30. The Ag layer 30 was 30 nm thick and the two layers of AIDCN 32 and 34 were 50 nm thick. The I-V curves for the device are shown in FIG. 10. As can be seen, the change in current is much less than the change when Al or Cu are used as the high conductivity material.

EXAMPLE 5

Figure 11:
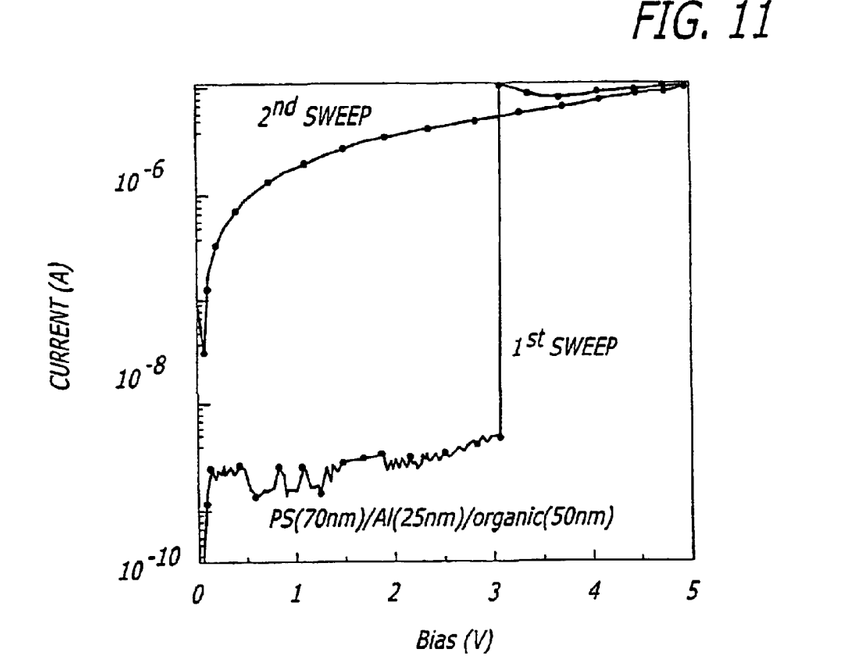
FIG. 11 is a graph of the I-V characteristics for a bistable electrical device as shown in FIG. 2 wherein the low conductivity material on one side of the high conductivity layer is polystyrene and the low conductivity material on the other side of the high conductivity layer is an organic semi-conductor.
Figure 12:
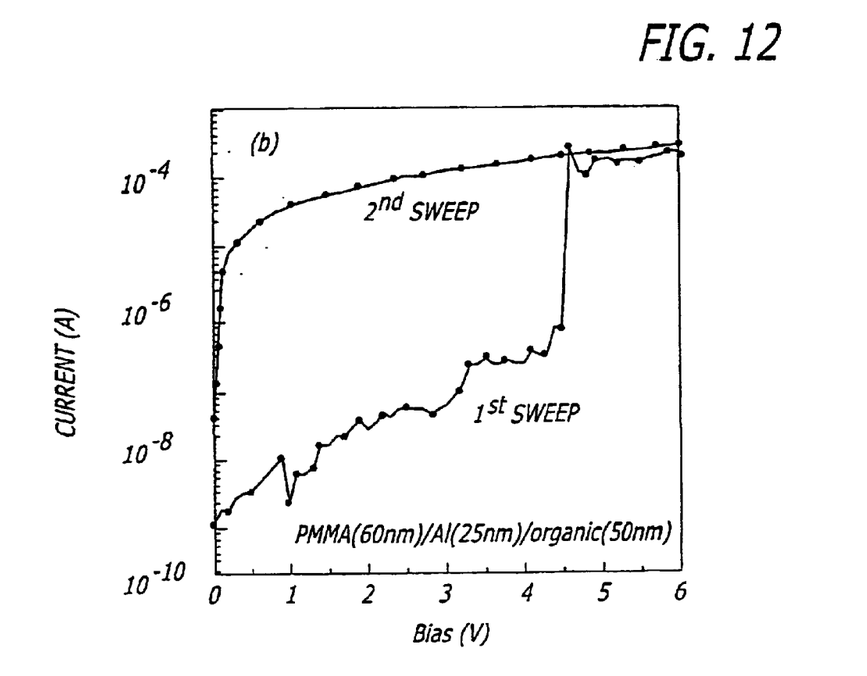
FIG. 12 is a graph of the I-V chracteristics for a bistable electrical device which is the same as the one measured for FIG. 11, except that the polystyrene layer was replaced with polymethylmethacrylate.

A bistable device was made according to Example 1 except that polystyrene (PS) was substituted for AIDCN in one of the low conductivity layers 32. The PS was first dissolved in p-xylene to produce a 2 weight percent solution. The polystyrene was spin cast on top of the Al electrode layer 36. The PS layer was 70 nm thick. The Al layer 30, AIDCN layer 34 and top Al electrode layer 42 were sequentially evaporated on top of the layer of polystyrene. The Al layer 30 was 25 nm thick and the AIDCN layer 34 was 50 nm thick. The I-V curves for this device are shown in FIG. 11 which demonstrate bistable phenomenon.

EXAMPLE 6

A bistable device according to Example 5 was made except that polymethylmethacrylate (PMMA) was substituted in place of PS. The PMMA layer 32 was 60 nm thick with the other two layers 30 and 34 being the same as in Example 5. The I-V curves for this device are shown in FIG. 2 which demonstrate bistable phenomenon.

EXAMPLE 7

A number of bistable devices were made according to Example 1 except that the thickness of high conductivity layer 30 was varied from 2 nm to 16 nm and above. It was found that the Coulomb step shifts to a lower voltage as the thickness of layer 30 is increased. The device exhibited a sharp transition from a high resistance state to a low resistance state at thicknesses of 16 nm and above. Accordingly, when the high conductivity material is present in the bistable body as a thin layer, it is preferred that the thickness of the layer be chosen to exhibit a sharp transition between electrical states. The preferred thickness may be determined by routine experimentation as demonstrated in this example.

EXAMPLE 8

The response time of devices made according to Example 1 was measured. A 6V pulse with a duration of 220 ns was applied (writing mode) to the bistable device, at the same time the current was measured (reading mode). The response time for transition from "0" (low conductive) state to "1" (highly conductive) state was determined to be less than 20 ns, which is suitable for use in high speed memory devices.

EXAMPLE 9

A bistable device was made where indium tin oxide/glass was used as the substrate. The resulting device had the following structure: ITO/AIDCN (40 nm)/Al (20 nm)/AIDCN (40 nm)/Al (50 nm). The device was made by sequentially evaporating the materials onto the ITO substrate.

Figure 13:
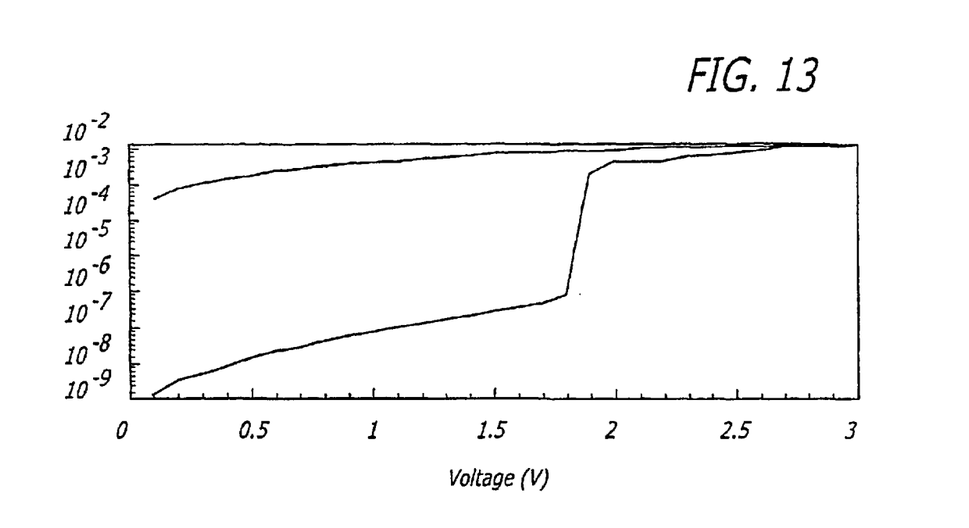
FIG. 13 is a graph of the I-V characteristics for a bistable electrical device as described in Example 9. The bottom curve is for the first bias sweep and the top curve is for the second bias sweep.

A graph of the I-V characteristics of the device is shown in FIG. 13 which demonstrates bistable electrical behavior.

EXAMPLE 10

A bistable device as shown in FIG. 1 was prepared by evaporating Al and AlDCN onto an aluminum electrode layer 14. A top electrode layer 16 was evaporated onto the previously deposited Al/AIDCN layer 12. The two Al electrode layers 14 and 16 were each_nm thick. The evaporation rate for the AIDCN and Al was about 2:1 with the resulting bistable body being 100 nm thick. It is anticipated that the Al is in the format as metal cluster, possibly inter-connected.

Figure 14:
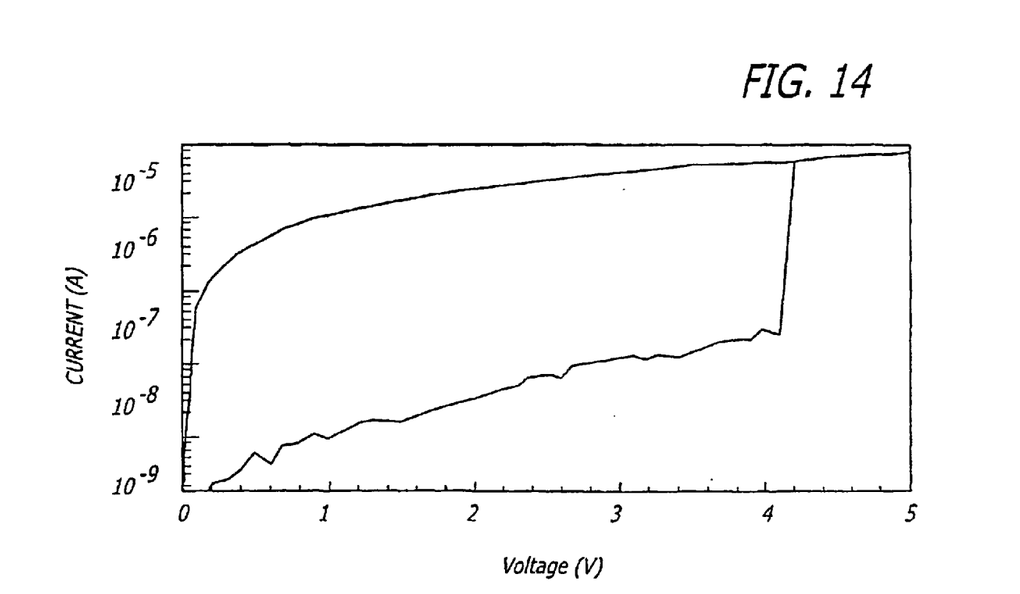
FIG. 14 is a graph of the I-V characteristics for a bistable electrical device as described in Example 10. The bottom curve is for the first bias sweep and the top curve is for the second bias sweep.

A graph of the I-V characteristics of the device as shown in FIG. 14 which demonstrates that the device is electrically bistable.

EXAMPLE 11

A memory device as shown in FIG. 5 was prepared. The device includes a regular polymer light emitting diode (PLED) and an electrical bistable layer. Poly(2-methoxy-5-(2'-ethyl-hexyloxy)-1,4-phenylene vinylene (MEH-PPV) was used as the electroluminescence material. The PLED has the structure ITO/PEDOT/MEH-PPV/Ca/Al and was made in accordance with the procedure set forth in Ref. 13.

The overall device was made as follows:

The conducting polymer layer 92 (3,4-polyethylenedioxythiophene-polystyrenesulfonate (PEDOT) was spin-coated onto a pre-cleaned ITO substrate and subsequently baked at 120° C. for 2 hours. The active luminescent layer 94 (MEH-PPV) was then spun on top of the PEDOT layer 92 by using a MEH-PPV solution with a concentration of 0.7 wt % (7 mg/ml) in dichlorobenzene. The MEH-PPV solution was subsequently baked at 70° C. for 2 hours. Additional details regarding the fabrication of PLEDs can be found in Ref. 13. The thickness of MEH-PPV layer was about 80 nm, which was determined using an Alpha-Step profilometer. The bilayer cathode of the PLED consists of a calcium layer 96 (50 nm) over-coated with an aluminum layer 98 (100 nm) deposited by conventional vacuum evaporation. Then the bistable layer 100 was deposited on top of the Al layer 98 by vacuum deposition. AIDCN and Al were co-deposited to form the bistable layer 100. The deposition ratio between the AIDCN and Al material was about 1:1. The depositions were carried out under the vacuum of about $2 \times 10^{-6}$ torr. The thickness of the deposited films was controlled by a quartz crystal monitor. Finally, Al layer 102 was deposited on the top of the memory layer as the cathode. The bistable layer 100 was 100 nm thick. The cathode 102 was 50 nm thick.

Figure 15:
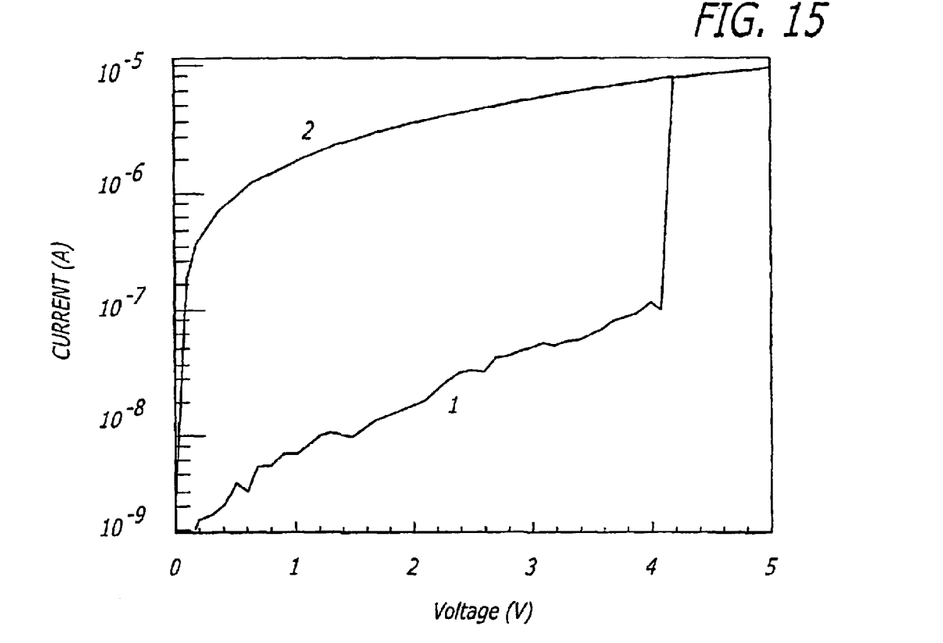
FIG. 15 is a graph of the I-V characteristics for a memory device of the type shown in FIG. 5 where the high conductivity material is dispersed as nanoparticles throughout the bistable body. Curve 1 is for the first bias ramp. It shows a current jump at about 4 V when the device is switched into the low resistance state. Curve 2 shows the second bias run where the device remains at the low resistance state.

Before fabricating the device with the PLED, the organic-metal electrical bistable device with the Al-AIDCN layer sandwiched between two Al electrodes was fabricated. The I-V characteristics of the electrical bistable device is shown in FIG. 15. Curve 1 in FIG. 15 is for the first bias ramp where it shows a current jump at about 4 V and the device is switched into a high conductance state. Curve 2 is for the second bias run where the device remains at the high conductance state thereby demonstrating the memory effect.

Figure 16:
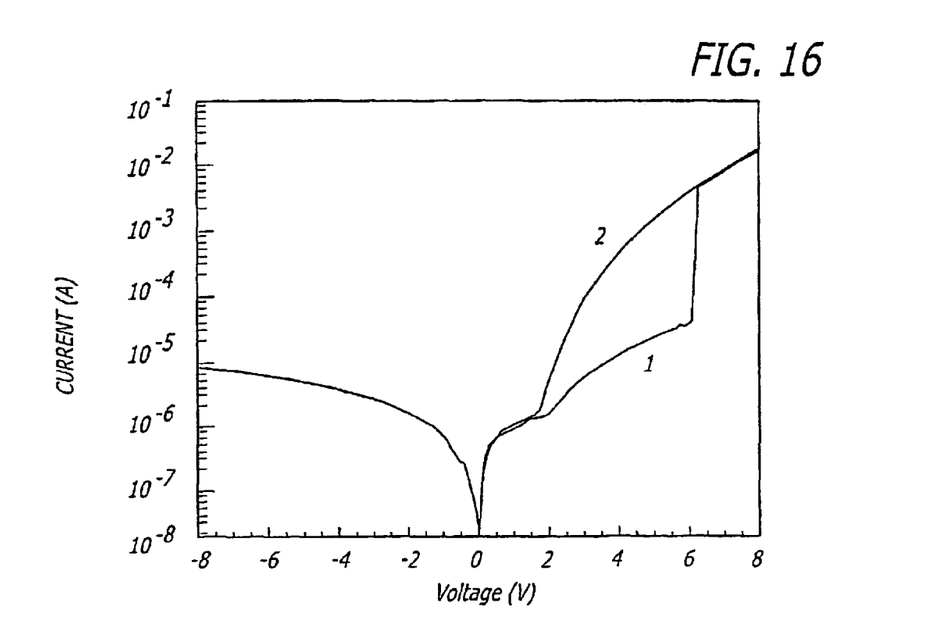
FIG. 16 is a chart showing the I-V characteristics of the polymer light-emitting diode of the device as shown in FIG. 5. Curve 1 depicts the first biased ramp where the current increases at about 6 volts. Curve 2 shows the second bias run where the device remains in the low resistance state.
Figure 17:
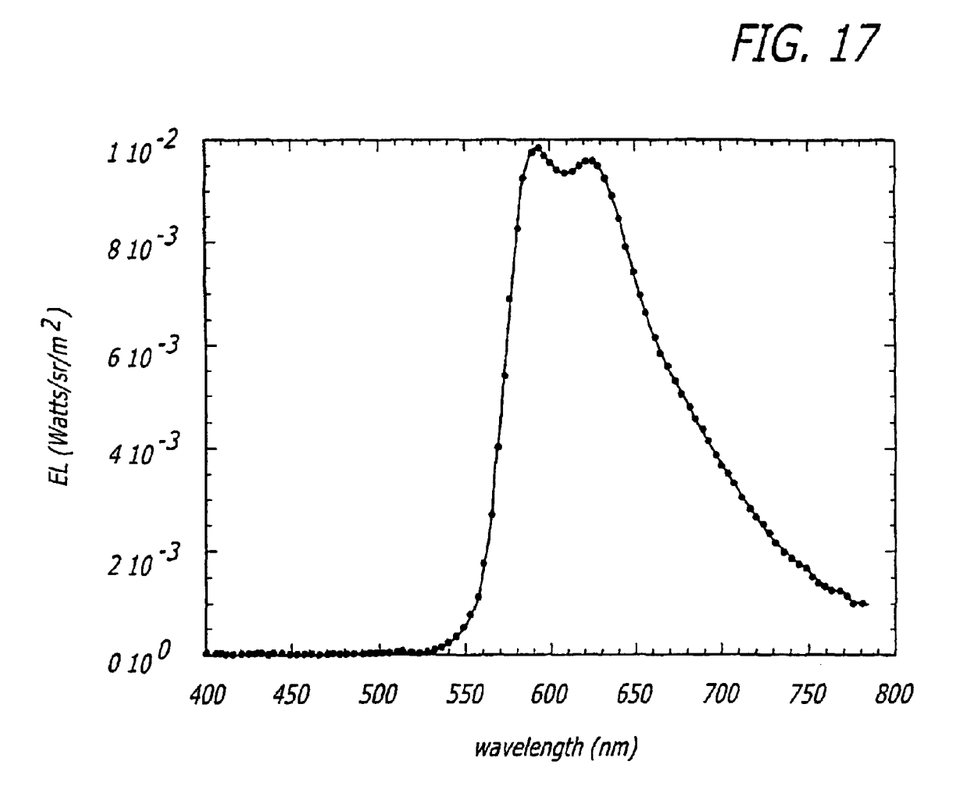
FIG. 17 is the electroluminescence spectrum of a light-emitting memory device as shown in FIG. 5 at an electrical current of 3 mA. The corresponding brightness of the device is about 280 cd/$M^2$.

A typical I-V curve for the final device (including the PLED) is shown in FIG. 16. In the first voltage scan (Curve 1), there is a sudden jump in electrical current at about 6 V bias. As shown by curve 1, the injection current was "switched-up" by 3 orders of magnitude. However, a second voltage scan on the device as shown in the curve 2 yielded higher injection currents even at lower biases with the two I-V curves overlapping in the higher voltage regime (voltages higher than 6 volts). These two I-V curves demonstrate the bistability of the device. Since this device includes a PLED and an electrical bistable layer, light emission from the device can be observed at medium bias at "on" state. FIG. 17 shows the EL (watts/sr/m$^2$) the optically readable device at an electrical current of 3 mA which was measured by a Photon Research 650 photometer. The corresponding brightness is about 280 cd/m$^2$. The regular function of the PLED is maintained in the device wile the memory effect of the bistable layer is reflected by the emission of light from the device.

The memory of this device was realized by applying a write-in voltage pulse to the device, and the memory was reflected by not only the electrical current, but the light emitted from the device. The emitted light can be read by a photon detector, camera or the naked eye. One of the advantages of the device is that it can be read in parallel, which enhances the read speed. Applying a voltage pulse above a critical amplitude for several tens nanosecond can switch the device into on state. It should be noted that one can also use small-molecule organic electroluminescence materials, such as Alq$_3$ (Ref. 14) instead of polymer materials to make the light-emitting layer.

Having thus described exemplary embodiments of the present invention, it should be noted by those skilled in the art that the within disclosures are exemplary only and that various other alternatives, adaptations and modifications may be made within the scope of the present invention. For example, a whole polymeric device with a structure of polymeric electrode (anode)/polymer (1)/polymer (2)/polymer (3)/polymeric electrode (cathode) can be structured via either spin coating, roll-to-roll coating, or thermal evaporation or a combination of all three techniques. The materials for polymer (anode), polymer (cathode) as well as polymer (2) can be either the same or different. Similarly, polymer (1) and polymer (3) can be the same or different. Similarly, a completely organic device having a structure of organic electrode (anode)/organic (1)/organic (2)/organic (3)/organic electrode (cathode) can also be constructed. Accordingly, the present invention is not limited to the above preferred embodiments and examples, but is only limited by the following claims.

Bibliography

1. J. F. Dewald, A. D. Pearson, W. R. Northover, and W. F. Peck, Jr., J. Electrochem. Soc., 109, 243c (1962). "Semiconducting glasses"
2. Ovshinsky, S. R. Localized states in the gap of amorphous semiconductors. Phys. Rev. Lett., vol. 36 (no. 24), Jun. 14, 1976, p. 1469–72.
3. Yu, G. Kriger, N. F. Yudanov, I. K., Igumenov, and S. B. Vashchenko, J. Struct. Chem., 34 (1993). "Study of test structures of a molecular memory element"
4. H. J. Hovel and J. J. Urgell, J. Appl. Phys. 42, 5076 (1971). "Switching and memory characteristics of ZnSe—Ge heterojunctions"
5. R. Kumai, Y. Okimoto and Y. Tokura, Science, 284, 1645 (1999). "Current-induced insulator-metal transition and pattern formation in an organic charge-transfer complex"
6. R. S. Potember, T. O. Poehler and D. O. Cowan, Appl. Phys. Lett. 34, 407 (1979). "Electrical switching and memory phenomena in Cu-TCNQ thin films"
7. F. Gamier, R. Hajlaoui, A. Yassar, and P. Shirakawa, Science 265, 1684 (1994)
8. F. Hide, M. A. Diaz-Garcia, B. J. Schwartz, M. R. A. Andersson, Q. Pei, and A. J. Heeger, Science 273, 1883 (1997).
9. R. Kumai, Y. Okimoto, Y. Tokura, Science 284, 1645 (1999).

10. W. Fujita, and K. Awaga, Science 286, 261 (1999).
11. J. H. Burroughes, D. D. C. Bradley, A. R. Brown, R. N. Marks, K. Mackay, R. H. Friend, P. L. Burn, and A. B. Holmes, Nature, 347, 539 (1990).
12. T. Yamada, D. Zou, H. Jeong, Y. Akaki, and T. Tsutsui, Synthetic Metals, 111–112,237 (2000).
13. J. Liu, Y. Shi, L. P. Ma, and Y. Yang, J. Appl. Phys. 88, 605 (2000).
14. Y. Hamada, C. Adachi, T. Tsutsui, S. Saito, Jpn. J. Appl. Phys. 31, 1812 (1992).
15. Y. Yang et al., U.S. Pat. No. 5,563,424, Oct. 8, 1996.

What is claimed is:

1. A bistable electrical device which is convertible between a low resistance state and a high resistance state, said device comprising:
   a bistable body which is electrically convertible between said low resistance state and said high resistance state, said bistable body comprising a first surface which defines a first electrode location and a second surface which defines a second electrode location, said bistable body comprising an organic low conductivity material and a sufficient amount of a high conductivity material wherein said bistable body is converted between said low resistance state and said high resistance state by application of an electrical voltage to said bistable body and wherein said high conductivity material is in the form of one or more layers that are from 0.5 nanometer to 5 micrometers thick;
   a first electrode attached to said bistable body at said first electrode location; and
   a second electrode attached to said bistable body at said second electrode location.

2. A bistable electrical device according to claim 1 wherein said organic low conductivity material is selected from the group consisting of organic semiconductors and organic insulators.

3. A bistable electrical device according to claim 1 wherein said high conductivity material is selected from the group consisting of metals, metal oxides, conducting polymers and organic conductors.

4. A bistable electrical device according to claim 1 wherein said bistable body is in the shape of a bistable layer having said first and second electrode locations located on opposite sides of said bistable layer.

5. A bistable electrical device according to claim 4 wherein said high conductivity layer is sandwiched between first and second low conductivity layers wherein said first electrode location is located on said first low conductivity layer and said second electrode location is located on said second low conductivity layer.

6. A bistable electrical device according to claim 1 which further includes a diode connected to at least one of said first or second electrodes.

7. A bistable electrical device according to claim 6 wherein said diode is a light emitting diode.

8. A method comprising the step of applying a sufficient electrical voltage across the first and second electrodes of the bistable device according to claim 1 to convert said device between said high resistance state and said low resistance state.

9. A bistable electrical device which is convertible between a low resistance state and a high resistance state, said device comprising:
   a bistable body which is electrically convertible between said low resistance state and said high resistance state, said bistable body comprising a first surface which defines a first electrode location and a second surface which defines a second electrode location, said bistable body comprising an organic low conductivity material and a sufficient amount of a high conductivity material wherein said bistable body is converted between said low resistance state and said high resistance state by application of an electrical voltage to said bistable body and wherein said high conductivity material is dispersed throughout said bistable body in the form of high conductivity particles having sizes ranging from 1 to 50 nanometers.

10. A bistable electrical device according to claim 9 wherein said bistable body is formed by condensing vapors of said high conductivity and low conductivity materials together to form said bistable body.

11. A bistable electrical device according to claim 9 wherein said high conductivity particles comprise a high conductivity material which is selected from the group consisting of metals, conducting polymers and organic conductors.

12. A bistable electrical device according to claim 9 wherein said low conductivity material is selected from the group consisting of organic semiconductors and organic insulators.

13. A bistable electrical device according to claim 9 which further includes a diode connected to at least one of said first or second electrodes.

14. A bistable electrical device according to claim 13 wherein said diode is a light emitting diode.

15. A method comprising the step of applying a sufficient electrical voltage across the first and second electrodes of the bistable device according to claim 9 to convert said device between said high resistance state and said low resistance state.

16. A memory device comprising:
   a bistable body which is electrically convertible between a low electrical resistance state and a high electrical resistance state, said bistable body comprising a first surface which defines a first electrode location and a second surface which defines a second electrode location, said bistable body comprising an organic low conductivity material and a sufficient amount of a high conductivity material wherein said bistable body is converted between said low resistance state and said high resistance state by application of an electrical voltage to said bistable body and wherein said high conductivity material is in the form of one or more layers that are from 0.5 nanometer to 5 micrometers thick;
   a first electrode attached to said bistable body at said first electrode location;
   a second electrode attached to said bistable body at said second electrode location;
   a memory input element for applying a voltage to said bistable body to convert said bistable body between said low electrical resistance state and said high electrical resistance state; and
   a memory readout element which provides and indication of whether said bistable body is in said low electrical resistance state or said high electrical resistance state.

17. A memory device according to claim 16 wherein said memory readout element is a light emitting diode.

18. A memory device according to claim 16 wherein said organic low conductivity material is selected from the group consisting of organic semiconductors and organic insulators.

19. A memory device according to claim 16 wherein said high conductivity material is selected from the group consisting of metals, metal oxides, conducting polymers and organic conductors.

20. A memory device according to claim 16 wherein said bistable body is in the shape of a bistable layer having said first and second electrode locations located on opposite sides of said bistable layer.

21. A memory device according to claim 20 wherein said high conductivity layer is sandwiched between first and second low conductivity layers wherein said first electrode location is located on said first low conductivity layer and said second electrode location is located on said second low conductivity layer.

22. A method for operating a memory device according to claim 16 comprising the step of applying a sufficient electrical voltage across said first and second electrodes of said memory device to convert said bistable body between said high resistance state and said low resistance state.

23. A memory device comprising:
a bistable body which is electrically convertible between a low electrical resistance state and a high electrical resistance state, said bistable body comprising a first surface which defines a first electrode location and a second surface which defines a second electrode location, said bistable body comprising an organic low conductivity material and a sufficient amount of a high conductivity material wherein said bistable body is converted between said low resistance state and said high resistance state by application of an electrical voltage to said bistable body and wherein said high conductivity material is dispersed throughout said bistable body in the form of high conductivity particles having sizes ranging from 1 to 50 nanometers;
a first electrode attached to said bistable body at said first electrode location;
a second electrode attached to said bistable body at said second electrode location;
a memory input element for applying a voltage to said bistable body to convert said bistable body between said low electrical resistance state and said high electrical resistance state; and
a memory readout element which provides and indication of whether said bistable body is in said low electrical resistance state or said high electrical resistance state.

24. A memory device according to claim 23 wherein said high conductivity particles comprises a high conductivity material which is selected from the group consisting of metals, conducting polymers and organic conductors.

25. A memory device according to claim 23 wherein said low conductivity material is selected from the group consisting of organic semiconductors and organic insulators.

26. A memory device according to claim 23 wherein said bistable body is formed by condensing vapors of said high conductivity and low conductivity materials together to form said bistable body.

27. A method for operating a memory device according to claim 23 comprising the step of applying a sufficient electrical voltage across said first and second electrodes of said memory device to convert said bistable body between said high resistance state and said low resistance state.

* * * * *